(12) United States Patent
El Khoury Maroun et al.

(10) Patent No.: US 11,139,167 B2
(45) Date of Patent: Oct. 5, 2021

(54) METHOD MAKING IT POSSIBLE TO OBTAIN ON A CRYSTALLINE SUBSTRATE A SEMI-POLAR LAYER OF NITRIDE OBTAINED WITH AT LEAST ONE OF THE FOLLOWING MATERIALS: GALLIUM (GA), INDIUM (IN) AND ALUMINIUM (AL)

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Michel El Khoury Maroun, Antibes (FR); Guy Feuillet, Saint-martin d'uriage (FR); Philippe Vennegues, Antibes (FR); Jesus Zuniga Perez, Biot (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/736,270

(22) PCT Filed: Jun. 16, 2016

(86) PCT No.: PCT/EP2016/063824
§ 371 (c)(1),
(2) Date: Dec. 13, 2017

(87) PCT Pub. No.: WO2016/202899
PCT Pub. Date: Dec. 22, 2016

(65) Prior Publication Data
US 2018/0182622 A1     Jun. 28, 2018

(30) Foreign Application Priority Data
Jun. 18, 2015   (FR) ..................................... 1555582
Nov. 30, 2015   (FR) ..................................... 1561618

(51) Int. Cl.
*H01L 21/00*      (2006.01)
*H01L 21/02*      (2006.01)
(Continued)

(52) U.S. Cl.
CPC ........ *H01L 21/02647* (2013.01); *C30B 25/04* (2013.01); *C30B 25/186* (2013.01);
(Continued)

(58) Field of Classification Search
CPC ......... H01L 21/02647; H01L 21/02381; H01L 21/0243; H01L 21/02433; H01L 21/02458;
(Continued)

(56) References Cited

U.S. PATENT DOCUMENTS 8,524,583 B2 * 9/2013 Chyi ................. H01L 21/02381
257/E21.109
8,536,030 B2 * 9/2013 Wunderer ............. C30B 23/025
117/95
(Continued)

FOREIGN PATENT DOCUMENTS

EP      2 136 390 A2    12/2009

OTHER PUBLICATIONS

Chiu et al., "Growth of semi-polar GaN-based light-emitting diodes grown on a patterned Si substrate," Gallium Nitride Materials and Devices VI, vol. 7939, No. 1, Feb. 10, 2011, pp. 1-5, XP060010970.
(Continued)

*Primary Examiner* — Mounir S Amer
*Assistant Examiner* — Alexander Belousov
(74) *Attorney, Agent, or Firm* — BakerHostetler

(57) ABSTRACT

A method making it possible to obtain, on an upper surface of a crystalline substrate, a semipolar layer of nitride material comprising any one from among gallium, aluminium or indium, the method comprises the following steps: obtaining, on the upper surface of the crystalline substrate, a plurality of parallel grooves which extend in a first direction, one of the two opposite facets exhibiting a crystal orientation; etching a plurality of parallel slices which extend in a second direction that has undergone a rotation with respect to the first direction of the grooves in such a way as to obtain
(Continued)

individual facets exhibiting a crystal orientation; epitaxial growth of the material from the individual facets.

3 Claims, 7 Drawing Sheets

(51) Int. Cl.
| | | |
|---|---|---|
| C30B 25/18 | (2006.01) | |
| C30B 29/40 | (2006.01) | |
| C30B 25/04 | (2006.01) | |
| C30B 29/68 | (2006.01) | |
| H01L 33/00 | (2010.01) | |
| H01L 21/306 | (2006.01) | |

(52) U.S. Cl.
CPC .......... *C30B 29/403* (2013.01); *C30B 29/406* (2013.01); *C30B 29/68* (2013.01); *H01L 21/0243* (2013.01); *H01L 21/0254* (2013.01); *H01L 21/02381* (2013.01); *H01L 21/02433* (2013.01); *H01L 21/02458* (2013.01); *H01L 21/02639* (2013.01); *H01L 21/02658* (2013.01); *H01L 33/007* (2013.01); *H01L 21/30608* (2013.01)

(58) Field of Classification Search
CPC ........... H01L 21/0254; H01L 21/02639; H01L 21/02658; H01L 33/007; C30B 25/04; C30B 25/186; C30B 29/403; C30B 29/406; C30B 29/68

See application file for complete search history.

(56) References Cited

U.S. PATENT DOCUMENTS

| | | | | |
|---|---|---|---|---|
| 2009/0267083 | A1* | 10/2009 | Cui | C30B 25/18 |
| | | | | 257/79 |
| 2010/0308437 | A1* | 12/2010 | Okuno | C30B 25/18 |
| | | | | 257/615 |
| 2011/0045658 | A1 | 2/2011 | Liu et al. | |
| 2011/0227198 | A1* | 9/2011 | Wunderer | C30B 23/025 |
| | | | | 257/615 |
| 2012/0135557 | A1 | 5/2012 | Okuno | |
| 2012/0276722 | A1* | 11/2012 | Chyi | H01L 21/02381 |
| | | | | 438/504 |

OTHER PUBLICATIONS

Honda, et al., "Growth of (1101) GaN on a 7-degree off-oriented (001)Si substrate by selective MOVPE", Journal of Crystal Growth, vol. 242, Issues 1-2, pp. 82-86, Jul. 2002.

Zheleva, et al., "Pendeo-Epitaxy—A New Approach for Lateral Growth of Gallium Nitride Structures", MRS Online Proceedings Library (OPL), vol. 537 (Symposium G—GaN and Related Alloys), 1998, XP008107819.

Hikosaka,et al., "Al doping in (1-101) GaN films grown on patterned (001)Si substrate", Journal of Applied Physics vol. 101, Issue 10, pp. 103513-1-103513-5, (2007).

Vennegues, et al., "Reduction mechanisms for defect densities in GaN using one- or two-step epitaxial lateral overgrowth methods", Journal of Applied Physics, vol. 87, Issue 9, (2000).

* cited by examiner

Prior Art

Prior Art

METHOD MAKING IT POSSIBLE TO OBTAIN ON A CRYSTALLINE SUBSTRATE A SEMI-POLAR LAYER OF NITRIDE OBTAINED WITH AT LEAST ONE OF THE FOLLOWING MATERIALS: GALLIUM (GA), INDIUM (IN) AND ALUMINIUM (AL)

CROSS-REFERENCE TO RELATED APPLICATIONS

This application is a National Stage of International patent application PCT/EP2016/063824, filed on Jun. 16, 2016, which claims priority to foreign French patent application Nos. FR 1555582, filed on Jun. 18, 2015, and FR1561618, filed on Nov. 30, 2015 the disclosures of which are incorporated by reference in their entirety.

FIELD OF THE INVENTION

The present invention relates generally to light-emitting diodes (LEDs) and more specifically LEDs comprising an epitaxial layer of at least one nitride (N) obtained with at least one of the following materials: gallium (Ga), indium (In) and aluminum (Al) that was grown on a substrate consisting of a different material.

BACKGROUND

The large-scale production of LEDs with high luminosity and at low cost for commercial applications such as replacement of domestic electric light bulbs has long been a subject of quite particular interest to many scientific and academic teams throughout the world.

A major step was made in Japan in 1994 by Shuji Nakamura of the Nichia Corporation, who was the first to demonstrate the feasibility of a blue LED of high luminosity based on the use of InGaN, i.e. indium gallium nitride, a semiconductor material consisting of a mixture of gallium nitride (GaN) and indium nitride (InN) which then forms a ternary direct-band-gap semiconductor of group III/group V. For the invention of the blue LED, Nakamura shared the 2014 Nobel Prize for physics with two other Japanese scientists.

Since then, the nitride compounds and more specifically gallium nitride (GaN) and its alloys with indium (In) and aluminum (Al) have been widely used for obtaining optoelectronic devices capable of operating in the short wavelength region of the visible spectrum, i.e. in the blue and ultraviolet (UV) region. Although the use of alloys based on GaN also allows high-performance green LEDs to be constructed easily, there is a drop in efficiency for this region of the spectrum, known by the name of "drop in efficiency in the green", or "green gap" in English. Green LEDs based on GaN, i.e. LEDs designed for operation in a wavelength range beyond 500 nm (nanometer=$10^{-9}$ meter), are unable to reach good efficiency of conversion of electric current into light, especially when they are compared with their blue and ultraviolet homologs. Efficiency close to 80% has been found for blue LEDs, whereas the corresponding figure for green LEDs is typically only about 15%.

The low efficiency observed with green LEDs can be explained on the basis of the crystallographic properties of the materials of GaN-based compound typically undergoing epitaxial growth on a substrate of a different nature, thus forming a multilayer hetero-structure. The stable crystallographic form of alloys based on GaN is the wurtzite crystal structure shown in FIG. 1. In this hexagonal structure 100, it is appropriate to define crystal planes such as: plane c 110; plane a 120 and plane m 130. As it has been discovered that it is relatively easy to grow an epitaxial layer of GaN-based material starting from plane c, i.e. in a direction parallel to the polar axis c 112, most of the experimental and commercial devices based on GaN have been constructed in this way. However, a negative consequence of this direction of growth, i.e. direction c 112 for LEDs, is that it gives rise to a quantum confined Stark effect (QCSE) in the active region of the quantum well in InGaN-based alloy of the device. This leads to a spectacular reduction in efficiency of radiative recombination because the electrons and holes are then separated spatially in the active region of the quantum well, which reduces the probability of their interacting to produce light. The reason for this behavior is that, in addition to spontaneous polarization, there is piezoelectric polarization of the crystal as a result of a mechanical stress that develops in this particular crystal structure, and is known as biaxial stress. Thus, the effects connected with polarization combined with a reduced active region (quantum wells) and reduced quality of the material are particularly detrimental for the quantum wells of higher indium compositions (i.e. those that are necessary for the green LEDs). These effects are therefore regarded as the main reasons explaining the losses of efficiency of optoelectronic devices based on nitride that operate at higher wavelengths (i.e. in the green).

FIG. 2 is a diagram 200 illustrating the effects of crystal orientation on the intensity of spontaneous and piezoelectric polarization present in InGaN quantum wells. FIG. 2 shows a typical variation of this parameter as a function of the orientation relative to orientation c. The intensity is in fact maximum 210 for polar orientation 112, i.e. as indicated above, when the GaN-based epitaxial layer grows perpendicularly to plane c 110. For nonpolar orientations such as those of plane a 120 and plane m 130, the intensity of polarization 220 crosses the zero axis. It should be noted here that, for a semipolar orientation, such as plane 140 shown in FIG. 1, the effect of the piezoelectric polarization may also be reduced, if compared to the polar orientation 230.

Growth starting from a substrate in a plane different from the classical plane c, for example in a semipolar plane such as 140, also has its problems. In particular, it has been observed that the GaN-based layers that were grown on flat substrates made of a different material typically have large dislocations and base-plane stacking fault densities if they were grown starting from a plane different from the classical plane c 110.

Consequently, to obtain flat semipolar structures while continuing to grow a GaN-based layer essentially in direction c in order to minimize the crystallographic defects, several R&D groups have described methods based on epitaxial growth. The following publications describe examples of methods of this kind:

"*Fabrication and properties of semi-polar* (1-101) *and* (11-22) *InGaN/GaN light emitting diodes on patterned Si substrates*" by T. Hikosaka et al. in phys. stat. sol. (c) 5, No. 6, 2234-2237 (2008).

"*Growth of* (1-0 1) *GaN on a 7-degree off-oriented* (0 0 1)*Si substrate by selective MOVPE*" by Honda et al. in J. Cryst. Growth 242 82-6 (2002).

An example given in the above publications is reproduced in FIGS. 3a-3d, which show, in FIG. 3a, V-shaped trenches 320 that were etched in a substrate 310. The width and the spacing of the trenches are in a range of a few micrometers. The trenches are etched in a silicon substrate 310 that has a crystal orientation that is, for example, offset by 7° relative to the {001} plane as defined by its standard Miller index. This allows the side walls of the trenches to form facets 330 having an orientation corresponding to the Miller index {111}, which is moreover known to be a good nucleation plane for starting to grow c-oriented GaN-based layers. As described in the above publications and shown in FIGS. 3b and 3c, this method allows silicon dioxide (SiO2) or silicon nitride (SiN) or titanium nitride (TiN) to cover all the surfaces apart from the {111} oriented facets 330. Next, epitaxy begins starting from this set of unmasked facets, in such a way that inclined growth of a GaN-based layer 342 in direction c 341 takes place first of all. Growth continues laterally until the GaN-based material overflows trenches above their edges so as to finally begin coalescing, as shown in FIG. 3d, in such a way that a flat surface 340 is formed that has a semipolar orientation (10-11).

It should be noted here that the (10-11) orientation is just one example, which only applies with growth taking place on Si whose orientation is offset by 7° relative to the {001} plane. Other orientations of semipolar GaN require different orientations of the silicon. Depending on the type of semipolar GaN-based layer desired, the orientation of the substrate must be selected in such a way that the angle between plane c of GaN and the semipolar plane desired is the same as the angle between the crystal facet of the side wall of the trench in the substrate and the surface of the substrate. When other orientations are envisaged, such as (20-21) and (11-22), it is necessary to use other silicon substrates, in this case Si (114) and Si (113) respectively.

Although some improvement in the performance of devices with green LEDs has been anticipated owing to the technique described above of growing the GaN-based epitaxial layer starting from the upper surface of a silicon substrate with V grooving, the best results reported show that the green LEDs still only have low efficiency, of the order of 20%, far from the values of the blue LEDs.

One aim of the invention is therefore to provide a solution for increasing the efficiency of LEDs and in particular of green LEDs by reducing the number of extended defects that are propagated to the surface.

Other aims, features and advantages of the present invention will be obvious to a person skilled in the art on examining the following description and referring to the accompanying drawings. It is envisaged that any additional advantage is incorporated herein.

SUMMARY OF THE INVENTION

To achieve this aim, one embodiment of the present invention relates to a method for obtaining at least one semipolar layer comprising at least one material comprising nitride (N) obtained with at least one of the following materials: gallium (Ga), indium (In) and aluminum (Al) on an upper surface of a crystalline substrate, said method comprising the following steps:

Obtaining, on the upper surface of the crystalline substrate, a plurality of parallel grooves that extend in a first direction, each groove comprising at least two opposite inclined facets, each groove being continuous and extending in said first direction, at least one of said two opposite facets having a {111} crystal orientation;

Masking the upper surface of the crystalline substrate, in such a way that the facets opposite to said facets having a {111} crystal orientation are masked and that said facets having a {111} crystal orientation are not masked;

Epitaxial growth of said layer.

The method also comprises the following steps performed after the steps of obtaining the plurality of parallel grooves and before the step of epitaxial growth of said layer:

etching a plurality of parallel trenches that extends in a second direction after undergoing a rotation, i.e. inclined, relative to said first direction of the grooves, thus interrupting the continuous grooves to form individual facets each having a {111} crystal orientation.

Preferably the trenches and the grooves each have a bottom, the bottom of the trenches being located at the same depth or below the bottom of the grooves.

Preferably during said step of epitaxial growth, said material only grows starting from said individual facets that have a {111} crystal orientation and that form said array.

The method of the invention makes it possible to reduce the available surface areas of the facets having a {111} crystal orientation and starting from which the nitride material comprising at least one of Ga, In and Al can grow, allowing a reduction of the footprint and thus a reduction of the defects extended during the epitaxial growth generated at the GaN/AlN/Si or AlN/Si interface while imposing growth in the appropriate direction +c.

The invention and the proposed method thus make it possible to reduce the density of the extended defects that are propagated to the surface, and hence, on the semipolar orientations which greatly reduce the effects of polarization, it is possible to obtain green LEDs having better efficiency.

Moreover, the fact that the facets having a {111} crystal orientation are delimited by trenches, therefore hollowed reliefs and not by a mask forming a projecting relief, makes it possible to respond effectively to the problems consisting of reducing the number of defects in the semipolar layer. In fact, delimitation of the {111} oriented facets by trenches and grooves allows growth and coalescence of the various nuclei at least partly at a distance from an underlying layer such as the bottom of the trenches and therefore partly at least above an "empty" space. In fact lateral growth takes place along the grooves and above the trenches that have been etched.

This allows better stress relief during growth of the nuclei and during coalescence. The stresses in the GaN layer are reduced and the number of defects in the semipolar layer 480 is also reduced.

Optionally, the method of the invention may additionally have at least any one of the following optional features and steps taken separately or in combination:

According to one embodiment, the molar ratio V/III of said material comprising nitride (N) and at least one of gallium (Ga), indium (In) and aluminum (Al) is between 100 and 2000. According to one embodiment, the molar ratio V/III of said material comprising nitride (N) and at least one of gallium (Ga), indium (In) and aluminum (Al) is between 300 and 500 and preferably between 380 and 420.

This ratio refers to the molar gas flow of each precursor during growth (for Ga, TMGa may be used as the precursor and, for N, NH3 may be used as the precursor). This ratio improves the direction of the semipolar growth, i.e. normal to the surface of the substrate, which thus makes it possible to obtain the crystals above the etched grooves and therefore the initial surface of the substrate.

According to one embodiment, the step of masking the upper surface of the crystalline substrate, in such a way that the facets opposite to said facets having a {111} crystal orientation are masked and that said facets having a {111} crystal orientation are not masked, comprises depositing a masking layer (460) consisting of a material comprising at least one of: silicon dioxide (SiO2) and/or silicon nitride (SiN) and/or titanium nitride (TiN).

According to one embodiment, deposition of a masking layer is an angular deposition executed in such a way that the whole of the upper surface of the crystalline substrate is masked, apart from said facets that have a {111} crystal orientation.

According to one embodiment, said material is a material based on gallium nitride (GaN). According to one embodiment, said material based on gallium nitride (GaN) consists of any alloys that further comprise aluminum (Al) and indium (In).

According to one embodiment, said material comprising nitride (N) and at least one of gallium (Ga), indium (In) and aluminum (Al) is any one of: gallium nitride (GaN), indium nitride (InN), aluminum nitride (AlN), aluminum gallium nitride (AlGaN), indium gallium nitride (InGaN), aluminum gallium indium nitride (AlGaInN), aluminum indium nitride (AlInN). In the following description of the invention, it is generally referred to as being a nitride material comprising at least one of gallium (Ga), indium (In) and aluminum (Al) or as so-called V-N materials.

According to one embodiment, said step of epitaxial growth comprises:
- a first epitaxial growth of a material based on aluminum nitride (AlN) starting from said individual facets that have a {111} crystal orientation and that form said array;
- at least one second epitaxial growth of a material based on gallium nitride (GaN) starting from said material based on aluminum nitride (AlN) that has undergone epitaxial growth.

This embodiment is particularly advantageous for preventing etching by remelting when the substrate comprises or consists of silicon.

According to one embodiment, the grooves are complete V-grooves in which the two opposite inclined facets meet at the bottom of the groove and together define the bottom of the groove. According to another solution, the grooves comprise a flat bottom and the two opposite facets meet at the bottom of the groove in the case of reduced etching times.

According to one embodiment, the length of said facets having a {111} crystal orientation is greater than 50 nm. The length of a facet is measured in the inclined direction of the facet from the upper surface of the substrate to the bottom of the groove.

According to one embodiment, the first direction in which the grooves mainly extend corresponds to a direction common to the plane of said upper surface of the crystalline substrate and to the <111> plane.

According to one embodiment, said first and second directions form an angle that is greater than 30°, preferably greater than 40°, preferably between 40° and 90° and that is preferably between 50° and 90° and that is preferably between 60° and 90°. This angle is the smallest angle formed by the two directions. According to one embodiment, this angle is greater than 50°. According to one embodiment, this angle is greater than 80°. According to one embodiment, this angle is equal to 90°. This angle is measured in a plane that is parallel to the surface of the bottom of the substrate. Thus, a second direction that has undergone a rotation relative to a first rotation signifies that the second direction is turned or inclined relative to the first direction.

According to one embodiment, the trenches are etched perpendicularly to the initial grooves.

According to one embodiment, the trenches have a depth that is greater than or equal to the depth of the grooves.

According to one embodiment, the trenches have vertical side walls. Of course, owing to the inaccuracy inherent in any industrial process, the side walls might not be exactly vertical.

According to one embodiment, the plurality of parallel grooves has a pitch p1 that is between 50 nm and 20 μm, preferably between 75 nm and 15 μm. These pitches make it possible to facilitate the process while facilitating coalescence. The pitch p1 of the grooves is the width of a groove plus the distance that separates two consecutive grooves. The pitch p1 is measured in a plane parallel to the bottom of the substrate.

According to one embodiment, the plurality of parallel trenches have a pitch p2 that is greater than (p1*0.8)/2.5 and preferably greater than (p1*0.9)/2.5. According to one embodiment, the plurality of parallel trenches has a pitch p2 that is less than 1.1*p1 and preferably less than p1. More generally, p2 is between p1/2.5±10% and p1 ±10%. The pitch p2 of the trenches is the width of a trench plus the distance that separates two consecutive trenches. The pitch p2 is measured in a plane parallel to the bottom of the substrate.

According to one embodiment, during the step of epitaxial growth of GaN, the temperature of the substrate is maintained between 700 and 1300° C. and preferably between 900 and 1100° C. These temperatures make it possible to improve the quality of the crystal.

The typical temperature ranges for starting to grow the following material are given below:
AlN: 900-1400° C.
GaN: 700-1300° C.
AlN: 900-1500° C.
InGaN: 400-900° C.
AlGaN: 900-1300° C.
AlInN: 600-1100° C.
AlInGaN: 500-1000° C.

According to one embodiment, during the step of epitaxial growth of said materials V-N, the pressure is maintained between 15 mbar and 1500 mbar and preferably between 15 mbar and 700 mbar.

According to one embodiment, the plurality of parallel grooves have a pitch p1, the plurality of parallel trenches have a pitch p2 that is between 0.9*p1 and 1.1*p1 and the small angle between said first and second directions is greater than 30°, preferably greater than 40°, preferably greater than 60°. According to one embodiment, this angle is between 55 and 65°. These ratios make it possible to facilitate simultaneous coalescence in all directions.

According to one embodiment said step of masking the upper surface of the crystalline substrate in such a way that the facets opposite to said facets having a {111} crystal orientation are masked and that said facets having a {111} crystal orientation are not masked is carried out so as to form a masking layer arranged between the substrate and said material and that covers the whole of the upper surface of the substrate apart from the individual facets having a {111} crystal orientation.

According to one embodiment, during said step of epitaxial growth, said material grows in the form of nuclei whose coalescence forms said semipolar layer and in which the dimensions of the trenches and grooves are configured to allow growth and preferably coalescence of at least some of the nuclei, and preferably all of the nuclei, without contact with, or at least without contact with all of, the bottom of the trenches, optionally covered with the masking layer.

According to one embodiment, during said step of epitaxial growth, said material grows in the form of nuclei whose coalescence forms said semipolar layer and in which the dimensions of the trenches and grooves are configured to allow growth and preferably coalescence of the nuclei with preservation of a space between at least some, and preferably all of the nuclei and the bottom of the trenches, optionally covered with the masking layer.

These embodiments make it possible to solve even more effectively the problems consisting of reducing the number of defects in the semipolar layer finally obtained.

According to one embodiment, the crystalline substrate consists of silicon (Si) or a silicon-based material. According to one embodiment, the growth of the semipolar layer of said at least one material comprising nitride (N) and at least one of gallium (Ga), indium (In) and aluminum (Al) is consequently growth in three dimensions (3D), which takes place starting from the array of individual facets having a {111} crystal orientation.

According to one embodiment, the initial upper structured surface is formed by a set of parallel grooves comprising at least one inclined edge with a {111} crystal orientation.

According to another embodiment, the invention relates to a method of fabrication of at least one light-emitting diode (LED) configured for emitting in the green wavelength region, comprising the method for obtaining a semipolar layer of at least one material comprising nitride (N) and at least one of gallium (Ga), indium (In) and aluminum (Al) on an upper surface of a crystalline substrate, according to the aforementioned method.

According to another embodiment, the invention relates to a microelectronic device comprising a crystalline substrate and a semipolar layer of at least one material comprising nitride (N) and at least one of gallium (Ga), indium (In) and aluminum (Al) on an upper surface of said crystalline substrate, the substrate comprising a plurality of parallel grooves that extend in a first direction, each groove comprising at least two opposite facets each forming a continuous line that extends in said first direction, at least one of said two opposite facets having a {111} crystal orientation.

The substrate also comprises a plurality of parallel trenches that extend in a second direction after undergoing a rotation relative to said first direction. The combination of the plurality of parallel grooves and the plurality of parallel trenches defines an array of individual facets having a {111} crystal orientation.

Optionally, the microelectronic device of the invention may additionally have at least any one of the following optional features, taken separately or in combination:

According to one optional embodiment, said material is in direct contact with the individual facets having a {111} crystal orientation.

According to one optional embodiment, the trenches and the grooves each having a bottom, the bottom of the trenches being at the same depth or deeper than the bottom of the grooves;

According to one optional embodiment, the device also comprises a masking layer that is arranged between the substrate and said material, the masking layer covering the whole of the upper surface of the substrate, apart from the individual facets having a {111} crystal orientation.

According to one optional embodiment, the plurality of parallel grooves has a pitch p1, the plurality of parallel trenches has a pitch p2 that is between 0.8*p1 and 1.2*p1 and the small angle defined by said first and second directions is greater than 30°. According to one embodiment, this angle is greater than 40° and is preferably greater than 60°. According to one embodiment, this angle is greater than 55°.

According to another embodiment, the invention relates to light-emitting diodes (LEDs) comprising a microelectronic device according to the invention.

According to another embodiment, the invention relates to a method of growing a semipolar layer of nitride material comprising at least one of gallium (Ga), indium (In) and aluminum (Al) on an upper structured surface of a crystalline substrate, said upper structured surface being arranged so as to comprise a set of facets in inclined parallel lines having a {111} crystal orientation, said method further comprising the steps consisting of:

carrying out a new structuring of the upper surface by etching a set of trenches inclined relative to the facets in lines, breaking the set of facets in lines into an array of {111} oriented individual facets;

growing the layer of said material starting from the array of {111} oriented individual facets.

Before starting growth of the semipolar layer of said material, all the surfaces of the upper structured surface, except the {111} oriented facets, are protected with a deposited layer of a material comprising silicon oxide (SiO2) and/or silicon nitride (SiN) and/or titanium nitride (TiN).

One advantage of the invention is that the seeding surfaces, i.e. the {111} oriented facets, used for starting growth of the epitaxial layer of nitride-based material, have their surface areas reduced because the trenches were etched first.

The invention has the advantage of reduction of the defects generated as a result of the reduction of the footprint of the material V-N on the substrate.

This allows a reduction of the amount of defects in the growing crystal in the epitaxial layer, thus making it possible to obtain green (yellow/red/ultraviolet) LEDs having better efficiency.

According to another embodiment, the invention relates to a method for obtaining a semipolar layer of at least one material comprising nitride (N) and at least one of gallium (Ga), indium (In) and aluminum (Al) on an upper surface of a crystalline substrate, said method comprising the following steps:

Obtaining, on the upper surface of the crystalline substrate, a plurality of parallel grooves that extend in a first direction, each groove comprising at least two opposite inclined facets each forming a continuous line that extends in said first direction, one of said two opposite facets having a {111} crystal orientation;

Etching a plurality of parallel trenches that extend in a second direction that has undergone rotation relative to said first direction of the grooves, the plurality of parallel trenches that thus define, with the grooves, a plurality of discontinuous facets having a {111} crystal orientation;

Masking the upper surface of the crystalline substrate, in such a way that the facets opposite to said facets having a {111} crystal orientation are masked and that said facets having a {111} crystal orientation are not masked;

Epitaxial growth of said base material starting from said facets having a {111} crystal orientation.

Figure 1:
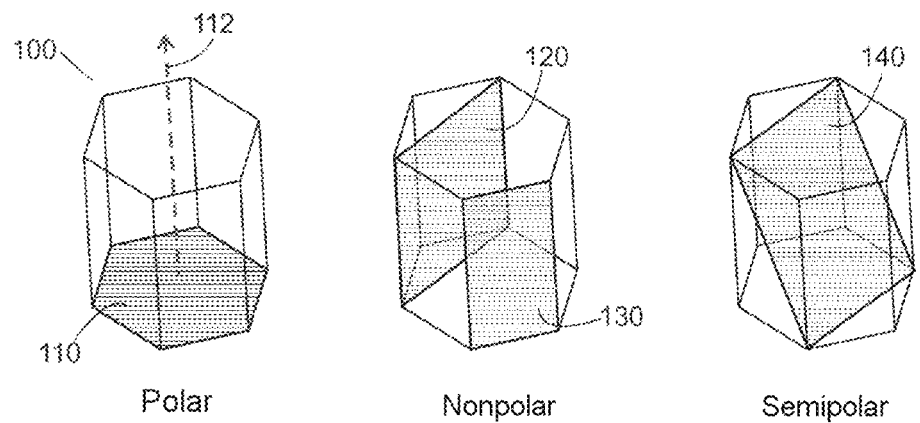
FIG. 1 illustrates different crystal orientations in a wurtzite crystal structure.
Figure 2:
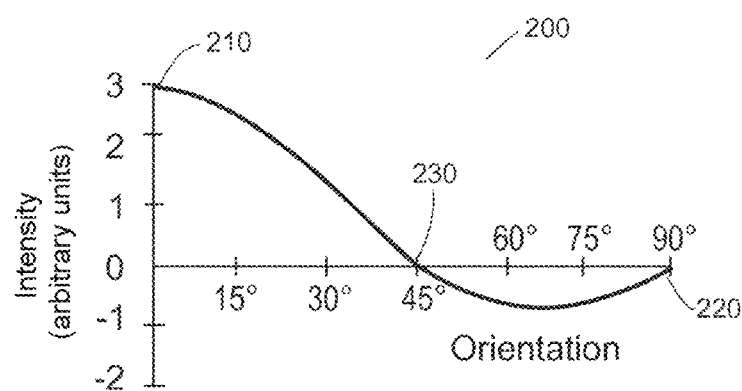
FIG. 2 shows the intensity of piezoelectric polarization in a wurtzite crystal structure as a function of the orientation.
Figure 3A:
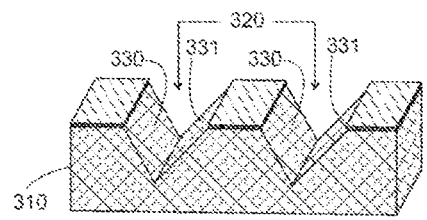
FIGS. 3a-3d show the growth of an epitaxial layer starting from a single set of {111} oriented facets as described in the prior art.
Figure 3B:
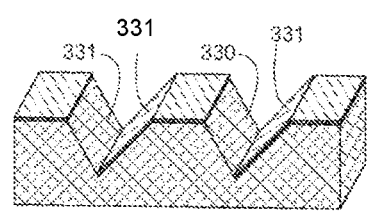
Figure 3C:
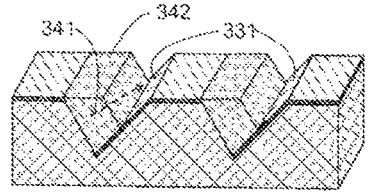
Figure 3D:
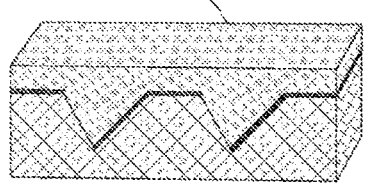

The figures are given as examples and do not limit the invention. They are basic schematic representations intended to facilitate understanding of the invention and therefore are not necessarily on the same scale as practical applications. In particular, the relative thicknesses of the various layers and films are not representative of reality.

DETAILED DESCRIPTION

The following detailed description of the invention refers to the accompanying drawings. The description comprises embodiments given as examples, but other embodiments are possible, and modifications may be made to the embodiments described without departing from the spirit and the field of application of the invention.

According to one embodiment, the method of the invention creates an array of structures with facets similar to pillars, starting from which multidimensional semipolar growth of at least one nitride (N) obtained with at least one of the following materials: gallium (Ga), indium (In) and aluminum (Al) is then effected. The array of structures with facets similar to pillars is obtained by forming grooves, typically V-grooves, and trenches that are perpendicular or inclined relative to the grooves.

The method of the invention therefore reduces the footprint of the epitaxial layer by reducing surface contact with the substrate so as to further reduce the density of extended defects generated during nucleation. This improvement of the material of the layers of material V-N with semipolar orientation allows further reduction of the loss of efficiency, i.e. of the loss of efficiency in the conversion of an electric current into light.

A detailed embodiment is described below, referring to FIGS. 4a to 4h.

Fabrication begins with the formation of grooves 320. These grooves may be V-grooves, such as those discussed above in FIGS. 3a-3d. They are etched in a substrate, preferably consisting of silicon.

As mentioned above and illustrated again in FIGS. 4a and 4b, creation of the V-grooves 320 is for example carried out starting from the surface of a crystalline layer 310, for example a substrate of silicon (Si) having a crystal orientation offset by 7° relative to the {001} plane. For the Si substrates, other orientations are possible, for example offset by 1° relative to the {114} plane and the {113} plane. The present invention is not limited to any one of these orientations. For example, the invention also applies to the silicon (Si) substrate 310 having a crystal orientation offset by 6° or 8° relative to the {001} plane.

Etching of the V-grooves is performed using well-known standard anisotropic techniques based on the use of wet etchants such as tetramethylammonium hydroxide (TMAH) or potassium hydroxide (KOH). This type of anisotropic etching allows {111} oriented facets 330 to be etched in the substrate 310.

Etching may create complete V-grooves 410, such as those described in FIGS. 3 and 4. In a complete V-groove, the two opposite inclined surfaces or facets 330, 331 meet to form the bottom 411 of the groove 410. Consequently, in a V-groove, the bottom 411 of the groove is V-shaped.

According to another embodiment of the invention, etching of the V-groove may create incomplete V-grooves 420. In an incomplete V-groove, the two opposite inclined surfaces meet at the bottom 421 of the groove, the bottom 421 forming an almost flat surface. Incomplete V-grooves 420 are obtained in shorter etching times than for the complete V-grooves 410.

The crystalline layer 310 has an outer face, also called upper surface. The parallel grooves 320, 410, 420 are oriented in a direction that corresponds to a direction common to the plane of the outer face of the crystalline layer 310 and to the <111> plane that we wish to expose by chemical etching. This direction is a direction of the <110> type. Thus, grooves 320, 410, 420 are parallel to the intersection between the plane of the upper surface of the crystalline layer 310 and the <111> plane. In the embodiment example of the invention illustrated by FIGS. 4a-4h, it is a direction of the <110> type.

The following nonlimiting example assumes the use of an Si substrate with a crystal orientation offset by 7° relative to the {001} plane. The V-grooves were etched after cutting a hard mask 430 in a layer of silicon dioxide (SiO2) or silicon nitride (SiN) or titanium nitride (TiN) grown or deposited on top of the substrate using standard lithographic techniques. A person skilled in the art will know how to select the most appropriate technique. For example, if submicron dimensions must be used, electron-beam or nanoprinting lithography techniques may be used.

Figure 4A:
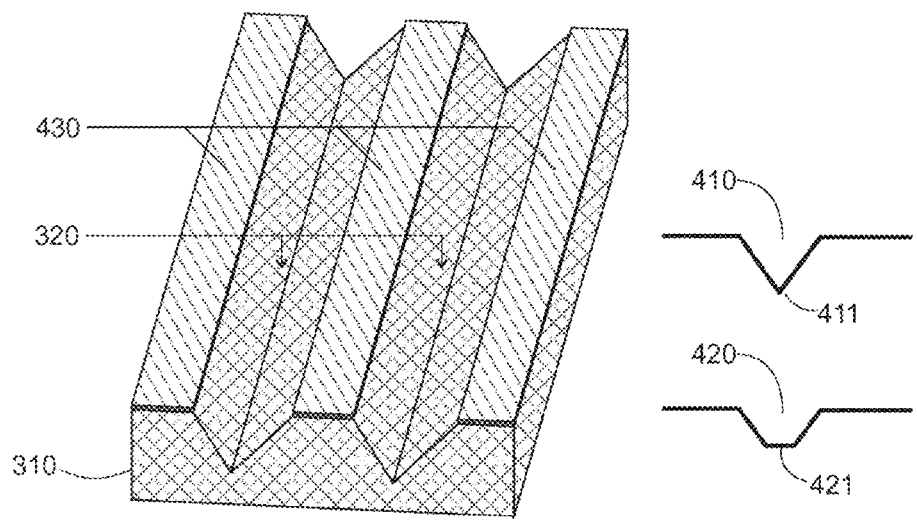
FIGS. 4a-4h illustrate the steps of a method according to one embodiment of the invention that allows a reduction of the density of the defects of the epitaxial layer after growth.
Figure 4B:
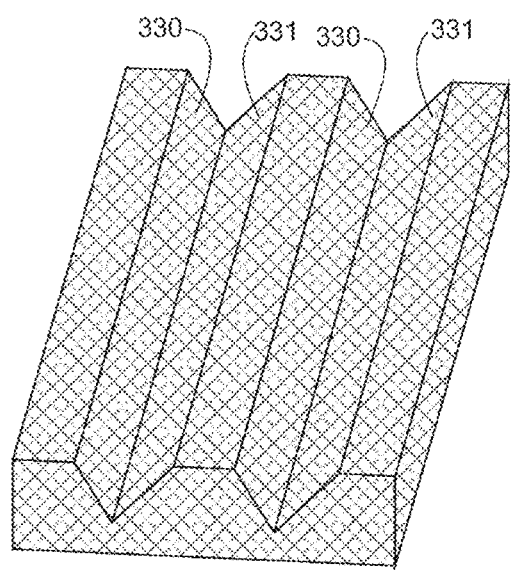

As shown in FIG. 4b, the SiO2 mask is removed subsequently, for example using a wet etchant, such as a solution of buffered oxide etchant (BOE), for example a dilute mixture of ammonium fluoride (NH4F) or of hydrofluoric acid (HF).

The grooves may be etched within the limits of a range of widths that may range from 100 nm and may reach 15 µm ($10^{-6}$ meter). Smaller dimensions, of the order of hundredths of nanometers ($10^{-9}$ meter), may possibly require the use of nanoprinting or electron-beam lithography techniques. Etching larger facets 330 means that the footprint is larger, in which case more defects are consequently created. The opposite is found for smaller facets. Regarding the repetition period of the grooves, the greater it is, the better is the level of dislocations as it tends to decrease during the first phases of growth, and any further extension of the crystals leads to the production of a material free from defects. It may prove necessary to decide on a compromise, depending on the applications. In all cases, it can be stated that shorter times with larger facets 330 finally create more defects.

Larger widths, in the µm range, risk giving rise to other problems such as obtaining good coalescence of the growing ends particularly on silicon, where there is also a risk of potential problems of etching by remelting arising. In fact, etching by remelting is a chemical reaction that takes place between gallium and silicon, leading to intensive diffusion of silicon at temperatures typical of MOCVD growth with a risk of damaging large areas on the wafer, and consequently posing an obstacle to any subsequent device fabrication. Advantageously, to prevent this phenomenon, before growth of gallium nitride (GaN), the method comprises growth of a first layer of aluminum nitride (AlN) on the substrate based on silicon, preferably consisting of silicon.

More generally, the step in which the at least one layer (480) consisting of at least one material comprising nitride (N) and with at least one of the materials selected from gallium (Ga), indium (In) and aluminum (Al) is grown may comprise several growth steps, each step comprising the growth of a material comprising nitride (N) with at least one of the materials from gallium (Ga), indium (In) and aluminum (Al).

For example, to grow a layer of GaN or of InGaN, the method comprises a first step of growing AlN directly starting from the individual silicon-based facets that have a {111} crystal orientation. Then GaN or InGaN is grown starting from the AlN.

Preferably, to grow a layer of AlInGaN or InN, the method comprises:
  a first step of growing AlN directly starting from the individual silicon-based facets that have a {111} crystal orientation;
  a second step of growing GaN starting from this growth of AlN.
  a third step of growing AlInGaN or InN starting from GaN.

Preferably, to grow a layer of InAlN, the method may comprise:
  a first step of growing AlN directly starting from the individual silicon-based facets that have a {111} crystal orientation;
  a second step of growing GaN starting from this growth of AlN.
  a third step of growing InAlN starting from GaN.

Preferably, to grow a layer of AlGaN, the method may comprise:
  a first step of growing AlN directly starting from the individual silicon-based facets that have a {111} crystal orientation;
  a second step of growing AlGaN starting from this growth of AlN.

According to another solution, more specifically, in the case when the Ga ratio is low enough, AlGaN is grown directly starting from the individual silicon-based facets that have a {111} crystal orientation.

Optionally, the size of the {111} facets 330 may vary as a function of the etching time. It is not obligatory to have complete V-grooves; it is possible to have incomplete grooves 420, in which case smaller facetted grooves are obtained.

Advantageously, since the facetted grooves are smaller, a lower dislocation density is obtained.

A masking layer is then formed, which is in the form of long strips.

For example, this mask is obtained from a layer of resin such as a light-sensitive resin deposited on the substrate 310 comprising the grooves 410, 420.

A second level of lithography is then performed by allowing insolation of the long strips of resin. This mask of the second level is optionally the same as that used for creating the V-grooves, which is used with different rotation. The result of this step is described in FIG. 4c, which shows the remaining lines 440, after the resin has been developed.

Any type of mask may be used and the invention is not limited to any particular masking material.

Optionally, the lines may be made at angles 470 different from an angle of 90°.

For example, the small angle 470 between the principal direction of the grooves 410, 420 and the principal direction of the lines is greater than 30° and is preferably between 40° and 90°. According to one embodiment, this angle is between 50° and 90°. According to one embodiment, this angle is between 55° and 65°. This angle 470 is measured in a plane that is parallel to the bottom of the substrate formed by the crystalline layer 310, i.e. in a horizontal plane according to FIGS. 4a to 4h. This angle is described in FIGS. 4c and 4d. Thus, this angle is defined between the direction of orientation of the strips 440 and the direction common to the plane of the outer face of the crystalline layer 410 and to the <111> plane, this common direction being, as indicated above, the direction of orientation of grooves 32, 410, 420.

The width 442 of the strips may also vary between a lower limit of 100 nm and an upper limit of 15 μm.

With the strips 440 of resin left in place, the unmasked areas of silicon are etched by any one of the many techniques for etching silicon used by the microelectronics industry. This creates trenches 450 as described in FIG. 4d.

Consequently, the {111} oriented continuous facets 330 previously defined by the grooves 410, 420 are now interrupted and each defines an alignment of individual facets 330' separated from one another by a trench 450.

Figure 4C:
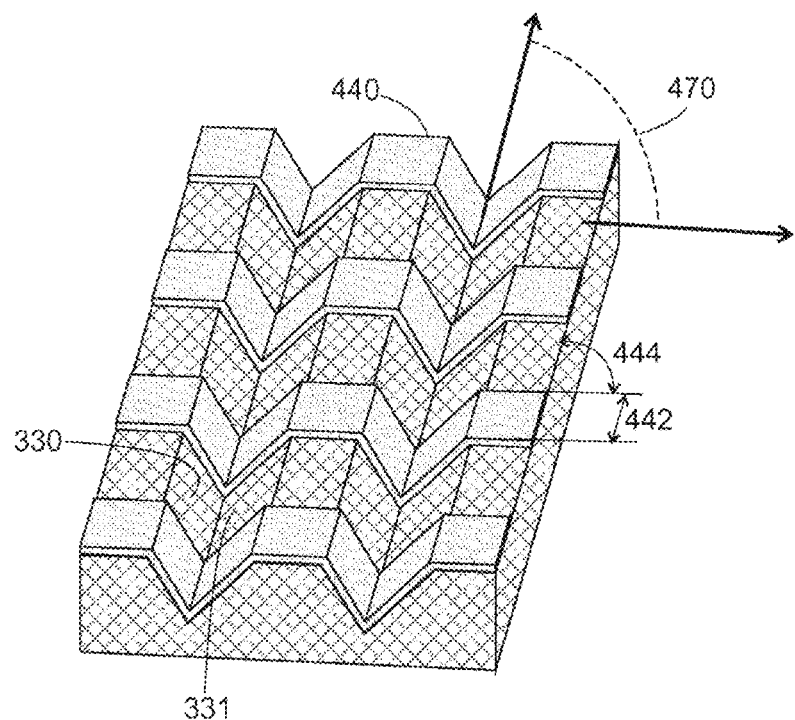
Figure 4D:
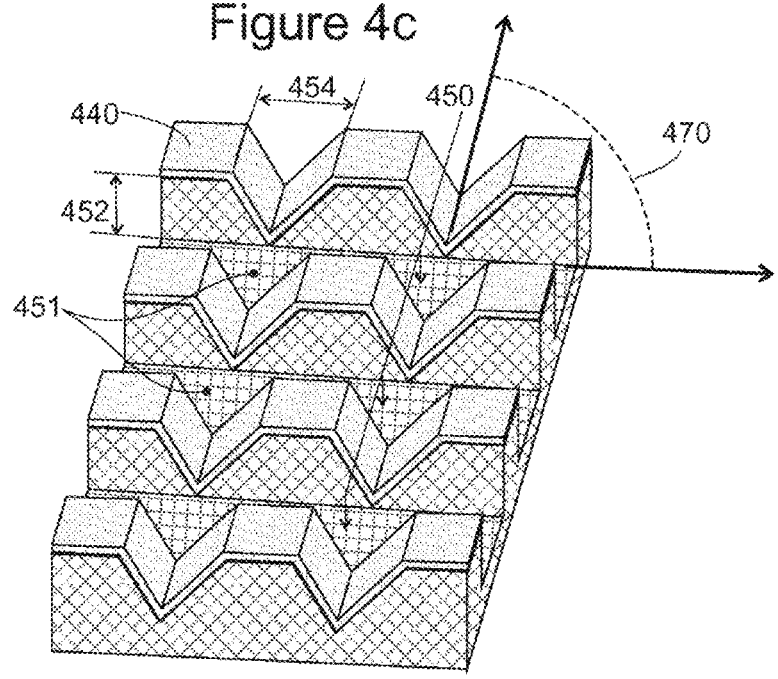
Figure 4E:
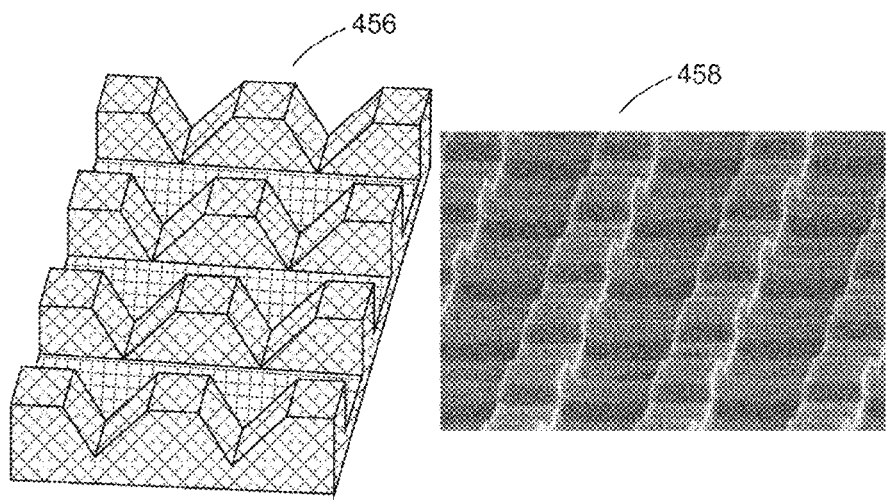

FIG. 4e shows trenches and V-grooves in an all-silicon substrate after etching through the mask of strips and after removing the mask. Reference 456 is a drawing of the result after etching, whereas 458 is a real image showing incomplete V-grooves 420 separated by trenches 450 with a bottom 451, which in this case is not flat. In practice, the surface of the bottom 451 of the cut-out trenches 450 reproduces the top of the surfaces of the V-grooves. It should be pointed out here that {111} oriented facets 330 are reproduced at the level of the bottom 451 of the trenches 450, but they are very deformed as a result of the etching and ion bombardment and they are therefore no longer compatible with good crystal growth.

The depth of the cut-out trenches 452 must, as a minimum, correspond to the bottom 411, 421 of the V-groove 320. This last-mentioned parameter depends on the width 454 of the aperture of the first mask. For example, if the aperture of the mask has a width of 5 μm, the depth of the V-groove created approaches 5 μm, which then requires trenches 450 with a depth of 5 μm. However, this is only one example of a particular orientation. The sizes may vary depending on the angles of the facets. For example, in Si (114) the {111} facets 330 are at 74° and 35°, which alters their size as a function of the depth.

More generally, the cut-out trenches 452 are as deep, or even deeper than the bottom 411, 421 of the V-groove.

The depth of the trenches 450 and of the grooves 320 is measured in a direction that is perpendicular to the bottom of the substrate 310. On the drawings described, the depth of the trenches 450 and grooves 320 is measured in the vertical direction.

Shallower etching is also acceptable, since growth is selective. Thus, a depth in a range between 100 nm and 50 μm works. The fact that the bottom of the etched groove is flat is not a crucial point because it will finally be covered with SiO2 and no growth will take place on it.

Figure 4F:
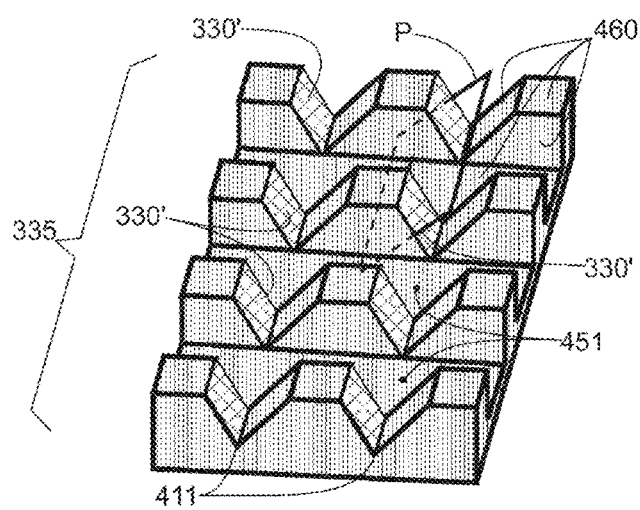

FIG. 4f shows the result of the next step, during which a masking layer 460, for example a dielectric layer based on or consisting of silicon oxide (SiO2) or silicon nitride (SiN)

is deposited on all the surfaces apart from the {111} oriented individual facets 330'. This step is carried out using standard ion beam sputtering (IBS) equipment in which the angle of deposition can be adjusted so as, in this case, to prevent deposition taking place on the {111} oriented facets 330. Consequently, the individual facets 330' together form an array 335 of individual facets 330' having a {111} orientation and separated from one another. In particular, the masking layer 460 covers the facets opposite to the {111} oriented facets, as can be seen in FIG. 4f for example.

Figure 4G:
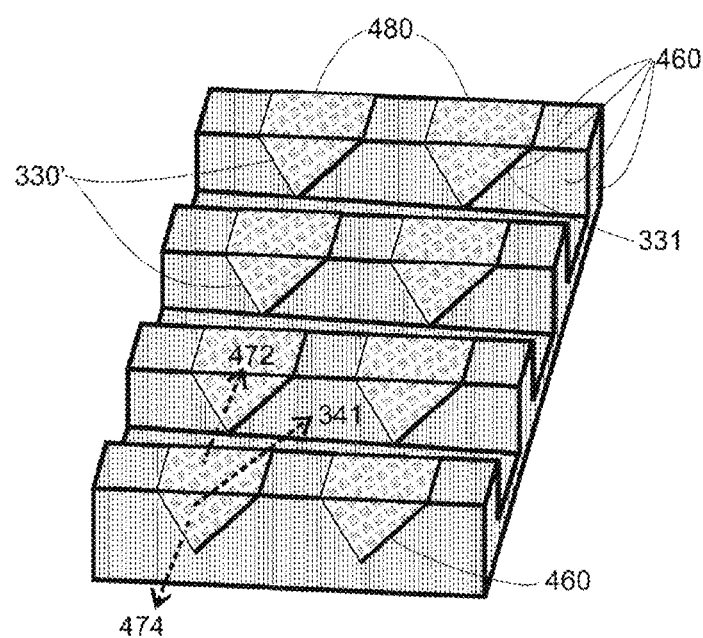

FIG. 4g shows how the growth of a nitride obtained with at least one of the following materials Ga, In and Al (material V-N) 480 begins starting from the individual {111} facets 330' that are not covered by the dielectric masking layer 460. As illustrated in FIGS. 4g and 4f, this masking layer 460 is located between the substrate 310 and the layer 480. Arrow 341 indicates, as before, the direction of growth in plane c, whereas arrows 472 and 474 indicate how, in the structure of the invention, growth also extends laterally to fill the trenches. It should be noted that FIG. 4g obviously only has the aim of showing the directions of growth and does not constitute an exact representation of reality. In practice, epitaxial growth allows lateral coalescence as well as coalescence on the lines, i.e. growth in each of the directions 341, 472, 474.

Growth mainly takes place in the direction 341.

Consequently, growth only takes place starting from said individual facets 330' that have a {111} crystal orientation.

With a longer growth time and in conditions of optimized growth, the crystal starts from the groove above the surface of the substrate. This may be obtained essentially with a low V-III ratio.

Figure 4H:
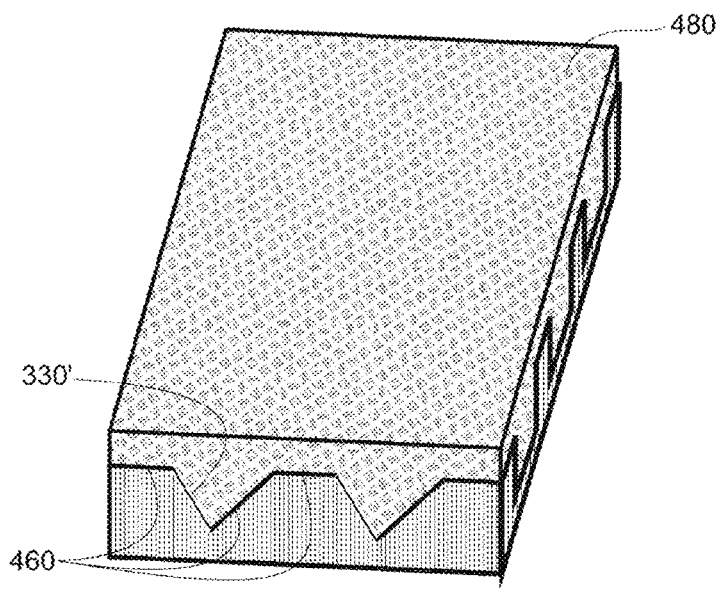

Finally, as shown in FIG. 4h, coalescence of all the crystals is obtained while growth of the epitaxial material continues until the final surface located highest forms a continuous semipolar layer 480 based on V-N.

Figure 5A:
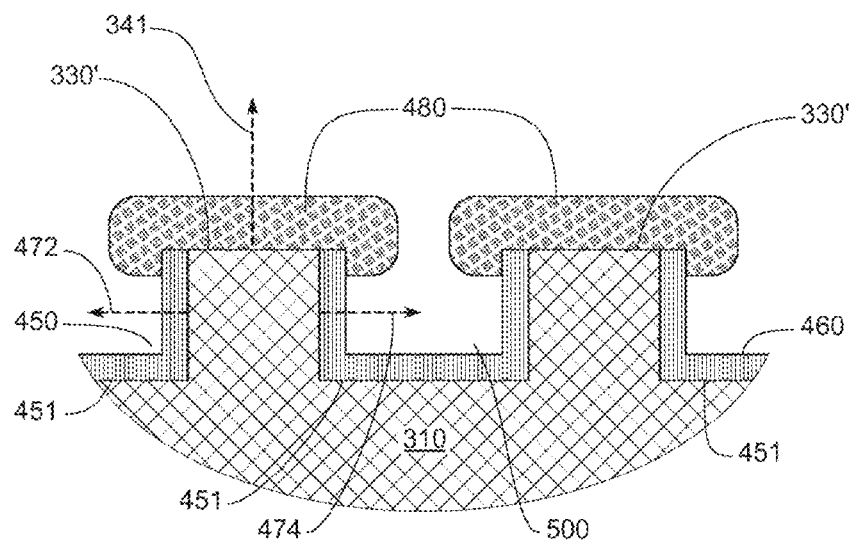
FIGS. 5a and 5b, are two sectional views of the structures illustrated in FIGS. 4g and 4h in sections passing through the {111} oriented facets, perpendicular to the {111} oriented facets and perpendicular to the parallel trenches.
Figure 5B:
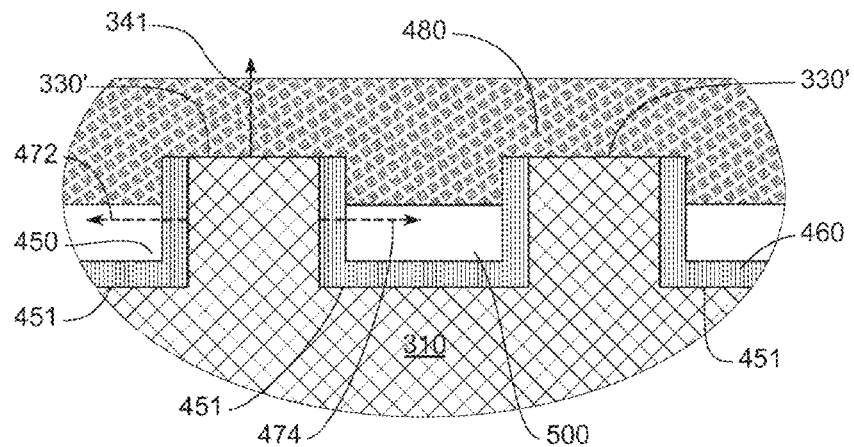

FIGS. 5a and 5b are two sectional views of the structures illustrated in FIGS. 4g and 4h in sections passing through the {111} oriented facets, perpendicular to the {111} oriented facets and perpendicular to the parallel trenches. The plane of this section is referenced P in FIG. 4f.

These figures thus show the {111} oriented facets 330' starting from which the nuclei 480 grow. In contrast to FIG. 4g, which is greatly simplified, FIG. 5a shows lateral growth of the nuclei 480, i.e. growth within the trenches 450, in directions 472 and 474 mentioned above. The directions of growth 341, 472 and 474 are also shown in FIGS. 5a and 5b. Lateral growth thus takes place along the grooves and above the etched trenches. This type of epitaxy may be called pendeo-epitaxy.

These {111} oriented facets 330' are located above the bottom of the trenches 541, preferably covered by the masking layer 460. The bottom 451 of the trenches 450 is the bottom formed by the hollow relief of the trench 450, whether or not this bottom is covered with one or more layers, such as a masking layer 460. This bottom may or may not be flat.

As illustrated in FIG. 5a, the nuclei 480 develop, before coalescence, "above the void", i.e. they develop at a distance from the bottom 451 of the trenches 450. An empty space 500, i.e. without solid material, is therefore present between the growing nuclei 480 and the substrate 310 covered by the masking layer 460.

Consequently, during at least a part of their growth, the nuclei 480 develop without being subjected to stresses resulting from contact with the bottom 451 of the trenches 450. This makes it possible to reduce defects in the nuclei 480, during at least part of their growth. The defects in the semipolar layer 480 finally obtained are therefore reduced.

As illustrated in FIG. 5b, according to a nonlimiting but particularly advantageous embodiment, coalescence of the nuclei 480 takes place while the latter are not in contact with the bottom 451 of the trenches 450 or while the latter are not entirely in contact with the bottom 451 of the trenches 450.

Preferably, the width (in directions 472 and 474) and depth (through the thickness of the substrate 310) dimensions of the trenches 450 and grooves 320 are configured to allow coalescence of the nuclei 480 without at least some of the nuclei being entirely in contact with the bottom 451 of the trenches 450. Naturally the thickness of the masking layer 460 is also dimensioned so as not to come into contact with the growing nuclei 480.

According to an advantageous embodiment, at least some and preferably all of the nuclei 480 are entirely at a distance from the bottom 451 of the trenches 450. Thus, these nuclei are not in contact with the bottom 451 of the trenches 450 or with optional layers such as the masking layer 460 covering the bottom of the trenches.

FIG. 5b thus illustrates an embodiment in which the space 500 is present between the semipolar layer 480 and the bottom of the trenches 450 optionally covered with the masking layer 460, after coalescence of the various nuclei.

Preferably, the space 500 is present between the final semipolar layer and the bottom of the trenches 450.

These embodiments provide several very advantageous technical effects.

Coalescence of the various nuclei above a trench 450, therefore above an "empty" space 500, allows better stress relief during coalescence and reduces the stresses in the layer of GaN.

This results in an epitaxial layer without a stress gradient in the zones undergoing lateral overgrowth.

For comparison, structures of the "ELO" type (an acronym of "epitaxial lateral overgrowth") induce curvatures of the upper and lateral facets that are reflected in problems during coalescence (generation of dislocations and possible cavities).

Finally the invention allows a significant reduction in the number of defects in the semipolar layer 480.

Moreover, the presence of this space 500, on at least one portion of the bottom 451 of the trenches, can facilitate delamination of the semipolar layer owing to the more fragile interface between the latter and the substrate. Thus, the invention allows a decrease in the risk of breakage of the layer of GaN during delamination.

It should be noted that these technical effects and advantages appear even if a part of the semipolar layer 480 is in contact with the bottom 451 of the trenches 450.

A nonlimiting example of a method of fabrication according to the invention is described below. The main steps of this method were described above referring to FIGS. 4a to 4h:

Step 1: Deposition of a protective layer 430 consisting, for example, of $SiO_2$ on a clean substrate 310. A thickness of the deposited layer of about 10 nm is sufficient, but may be adjusted. SiN or TiN may also be used in place of $SiO_2$.

Step 2: Lithography with a first mask cut out in lines and development of the resin.

Step 3: While the resin is still on top, the exposed protective layer ($SiO_2$ or SiN or TiN) is, for example, etched in a trifluoromethane plasma in the presence of oxygen ($CHF_3/O_2$ plasma). Other etchants may also be used. This step aims to create an aperture for subsequent anisotropic wet etching with KOH or TMAH. According to another solution, an etchant of buffered oxide (BOE) may be used for removing the mask.

Step 4: The resin is removed using a plasma of acetone and oxygen.

Step 5: Etching with KOH or TMAH begins to create the desired {111} facets 330 that form complete or incomplete V-grooves 320 as shown in FIG. 4*a*.

Step 6: The grooved substrates are cleaned with hydrogen chloride (HCl) to remove the crystalline residues of KOH from the surface.

Step 7: The protective mask of SiO2 or SiN or TiN is removed using a buffered etching solution BOE, thus giving an all-silicon cut-out substrate as shown in FIG. 4*b*.

Step 8: Lithography with a second mask in lines. The masks may optionally be the same as the first mask but used with a different orientation. The lithography must consequently be adapted according to the depth of the V-groove. For example, a V-groove with a depth of 5 µm requires an exposure energy of 200 mJ and, finally, longer development times. A shallower groove, for example with a depth of 1 µm, requires less exposure energy, of the order of 120 mJ. The figures mentioned above also depend on the type of resin used and the resultant thickness.

The resin is then developed (FIG. 4*c*).

Step 9: Starting from the resin forming patterns and used as a mask, anisotropic etching of the silicon is carried out in an induction coupled plasma (ICP) of sulfur hexafluoride (SF6) (or other etchants) to form trenches 450 having straight side walls (FIG. 4*d*).

Step 10: The resin is removed using plasma of acetone and oxygen.

Step 11: Angular deposition of SiO2 or SiN or TiN is performed on all the surfaces apart from the {111} facets to force growth of the epitaxial layer in a single direction c.

Step 12: A layer of nitride is grown epitaxially, obtained with at least one of the following materials: gallium (Ga), indium (In) and aluminum (Al) starting from the unmasked {111} facets. Depending on the nature of said nitride obtained with at least one of the following materials: gallium (Ga), indium (In) and aluminum (Al), a first layer, typically of AlN, is grown first on the facets 330'.

Throughout the preceding steps, the protective coatings that form the masks may be replaced with any type of other masking material.

The following growth rates were observed in experiments:

Semipolar growth rate: 1 nm/s

Growth rate in the direction +c: 2.5 nm/s, i.e. about 2.5 times quicker than growth in the semipolar direction.

Some additional details concerning the carrying out of the invention are given below. These details concern in particular growth of the GaN-based epitaxial layer for the growth rates mentioned above.

Materials: V/III molar ratio between 100 and 2000. This ratio must be kept as low as possible. According to a preferred embodiment, the ratio V/III is approximately equal to 440, but similar results can be obtained with values below 440 and may reach values up to 2000. These values also depend on the configurations and the mass flow rate capacities in MOCVD (metal-organic chemical vapor deposition) reactors. Experiments were conducted with a Thomas Swan epitaxy reactor with direct control (CCS, for Close Coupled Showerhead) manufactured by AIXTRON AG.

Temperature: Advantageously, the temperature is kept above 1000° C. This makes it possible to improve the quality of the crystal. Lower temperatures may give wavy facets.

Pressure: The pressure will preferably be maintained between 50 and 700 mbar. However, it has been found that the pressure is not a crucial parameter that depends on the capacities of the reactor.

These growth conditions make it possible to improve the direction of semipolar growth and consequently allows the crystals to be obtained on the surface of the substrate.

According to a nonlimiting embodiment, the pattern obtained according to the invention may have the following dimensions:

Pitch p1 of V-groove 320: This pitch p1 may also be defined as the period for the first level of lithography. Preferably, it is within a range such that 50 nm≤p1≤15 µm. This can facilitate treatment on large areas while allowing effective coalescence. The pitch p1 of the grooves 320 is the width 454 of a groove plus the distance that separates two consecutive grooves. The pitch p1 is measured in a plane parallel to the bottom of the substrate 310, i.e. horizontally in the figures described.

Pitch p2 of trenches 450: This pitch p2 may also be defined as the period of the second level of lithography. Typically, p2 is selected to be 2.5 times smaller than p1. For example, if p1 is selected to be equal to 10 µm, p2 must be close to 4 µm ±30%. Advantageously, this ratio guarantees simultaneous coalescence in all directions. Consequently, according to a preferred embodiment, the pitch of the V-grooves 320 and the pitch of the trenches 450 are adjusted accordingly. The pitch p2 of the trenches 450 is the width of a trench plus the distance that separates two consecutive trenches 450. The pitch p2 is measured in a plane parallel to the bottom of the substrate 310, i.e. horizontally in the figures described.

Dimension of the facet from which epitaxial growth of a nitride will be started, obtained with at least one of the following materials: gallium (Ga), indium (In) and aluminum (Al): the dimensions of the facet range from 50 nm up to a value of complete V-groove that depends on the pitch and the aperture.

Any reduction of contact between the substrate and the growing layer of material based on V-N will reduce the number of defects generated. In terms of spatial distribution of the dislocation chains, this substrate configuration makes it possible to reduce the number of initial defects generated as a result of the substrate/V-N material interface contact.

Moreover, the method of the invention allows formation of a larger number of crystalline zones before coalescence, which means more inflexion of the dislocations along the basal plane, and consequently fewer dislocations propagating to the surface, as explained in the works of P. Vennéguès et al. "Reduction mechanisms for defect densities in the V-N material using one- or two-step epitaxial lateral overgrowth methods", JOURNAL OF APPLIED PHYSICS, AMERICAN INSTITUTE OF PHYSICS. NEW YORK, US, Vol. 87, no. 9, 1 May 2000 (2000-05-01), pages 4175-4181.

Regarding the distribution of the basal-plane stacking faults (BSFs), and since it is known that BSFs are generated starting from the direction of growth −c, creation of the pillar structure of the invention leads to a further reduction of the extension in plane −c and consequently reduction of the BSFs.

It is clear from the above description that the invention makes it possible to reduce crystallographic defects when growing an epitaxial layer of a nitride obtained with at least one of the following materials: gallium (Ga), indium (In) and aluminum (Al) on a silicon substrate.

The invention thus makes it possible to obtain green LEDs having better efficiency.

The invention is not limited to the embodiments described above but extends to all the embodiments covered by the claims.

The invention claimed is:

1. A microelectronic device comprising a crystalline substrate and a semipolar layer of at least one material comprising nitride (N) and at least one of gallium (Ga), indium (In) and aluminum (Al) on an upper surface of said crystalline substrate, the substrate comprising a plurality of parallel grooves that extend in a first direction, each groove comprising at least two opposite inclined facets each forming a continuous band that extends in said first direction, at least one of said two opposite facets having a crystal orientation {111};

wherein the substrate also comprises a plurality of parallel trenches that extend in a second direction, said second direction being non-parallel to said first direction;

the combination of the plurality of the parallel grooves and the plurality of the parallel trenches defines an array of individual facets having the crystal orientation {111};

wherein said array comprises at least three parallel trenches and at least three parallel grooves, the trenches and the grooves each having a bottom, the bottom all of the trenches comprised by the substrate being located below the bottom all of the grooves comprised by the substrate;

said material being in direct contact with the individual facets having the crystal orientation;

the device also comprising a masking layer arranged between the substrate and said material and that covers the whole of the upper surface of the substrate apart from the individual facets having the crystal orientation, wherein said material is not in direct contact with the bottom of the trenches.

2. The microelectronic device as claimed in claim 1, wherein the plurality of parallel grooves have a pitch p1, in which the plurality of parallel trenches have a pitch p2 that is between 0.8*p1 and 1.2*p1 and wherein the small angle defined by said first and second directions is greater than 40°, and is preferably greater than 60°.

3. Light-emitting diodes comprising a microelectronic device as claimed in claim 1.

* * * * *